United States Patent
McKinnell et al.

(10) Patent No.: US 7,332,411 B2
(45) Date of Patent: Feb. 19, 2008

(54) SYSTEMS AND METHODS FOR WAFER BONDING BY LOCALIZED INDUCTION HEATING

(75) Inventors: James McKinnell, Salem, OR (US);
Chien-Hua Chen, Corvallis, OR (US);
John Liebeskind, Corvallis, OR (US);
Ronald A Hellekson, Eugene, OR (US)

(73) Assignee: Hewlett-Packard Development Company, LP, Houston, TX (US)

( * ) Notice: Subject to any disclaimer, the term of this patent is extended or adjusted under 35 U.S.C. 154(b) by 230 days.

(21) Appl. No.: 10/917,123

(22) Filed: Aug. 12, 2004

(65) Prior Publication Data

US 2006/0033201 A1   Feb. 16, 2006

(51) Int. Cl.
*H01L 21/46* (2006.01)
*H01L 21/30* (2006.01)
*H01L 21/00* (2006.01)
*H01L 21/50* (2006.01)
*H01L 21/48* (2006.01)
*H01L 21/762* (2006.01)

(52) U.S. Cl. .................. 438/456; 438/64; 438/106; 257/E21.567

(58) Field of Classification Search ............ 438/456, 438/555, 55, 57, 64, 106; 257/E21.567
See application file for complete search history.

(56) References Cited

U.S. PATENT DOCUMENTS 5,058,800 A  * 10/1991 Yoshizawa et al. .... 228/180.21

| | | |
|---|---|---|
| 5,895,233 A | 4/1999 | Higashi et al. |
| 6,036,872 A | 3/2000 | Wood et al. |
| 6,686,653 B2 | 2/2004 | Jerominek et al. |
| 6,689,638 B2 | 2/2004 | Lin et al. |
| 6,710,434 B1 | 3/2004 | Bai |
| 7,064,004 B2 * | 6/2006 | Frutschy .................. 438/107 |
| 7,105,931 B2 * | 9/2006 | Attarwala ................. 257/783 |

OTHER PUBLICATIONS

Lin, Liwei, et al., Formation of Silicon-Gold Eutectic Bond Using Localized Heating Method, Japanese Journal of Applied Physics, vol. 37 (1998) pp. L 1412-L1414.

Lin, Liwei, Untitled powerpoint presentation, Nov. 1999, University of California at Berkeley, pp. 5, 13-16, 18-20, 22, 24, 26-27.

Chiao, Mu et al., Hermetic wafer bondign based on rapid thermal processing, Sensors and Actuators A 92 (2001), Elsevier, pp. 389-402.

Cheng, Y.T. et al., Localized Silicon Fusion and Eutectic Bonding for MEMS Fabrication and Packaging, Journal of Microelectromechanical Systems, vol. 9, No. 1 (Mar. 2000) pp. 3-8.

* cited by examiner

*Primary Examiner*—Luan Thai

(57) ABSTRACT

A system and method bond wafers using localized induction heating. One or more induction micro-heaters are formed with a first substrate to be bonded. A second substrate is positioned in intimate contact with the induction micro-heaters. An alternating magnetic field is generated to induce a current in the induction micro-heaters, to form one or more bonds between the first substrate and the second substrate.

17 Claims, 10 Drawing Sheets

FIG. 3 *PRIOR ART*

SYSTEMS AND METHODS FOR WAFER BONDING BY LOCALIZED INDUCTION HEATING

BACKGROUND

An integrated circuit ("IC") or micro-electromechanical system ("MEMS") is typically packaged using one or more bonding techniques. In conventional wafer bonding using solder, eutectic alloy or metal-to-metal thermo-compression bonds, heat is transferred to the wafer by conduction or convection. There are two main disadvantages in using these heat transfer methods: it takes several minutes for the wafer to reach the required bonding temperature; and the entire wafer is heated to the bonding temperature, thereby stressing devices (e.g., IC and MEMS devices) fabricated on the wafer.

To provide rapid localized heating in wafer bonding, a micro-heater (also known as a micro-strip heater) may be used. The micro-heater is formed by depositing an electrically conductive heating track, often a loop, onto a first substrate such that the heating track is formed in the area of the intended bond between the first substrate and a second substrate (sometimes denoted as a "lid"). The heating track has two contact pads that allow electrical connection between an external power source and the micro-heater; this power source supplies current that passes through the heating track and generates heat such that a bond is formed between the first and second substrates. The micro-heater restricts heating to the area of the intended bond, which may be surrounded by insulating materials.

By way of example, FIG. 1 shows a cross-section through a prior art package 10 during encapsulation of a device 14 within a cavity 18 formed by bonding of a silicon substrate 12 to a second substrate 16 using a poly-silicon micro-heater 24. Device 14 is, for example, an IC or MEMS device created, respectively, using an IC or MEMS fabrication process.

Micro-heater 24 is deposited onto substrate 12 with a heating track 25 at locations 20 and 22 such that heating track 25 is in contact with silicon substrate 12 and second substrate 16. Micro-heater 24 has contact areas 26 and 28 that facilitate connection to probes 30 and 32, respectively, of an external power source 34. Second substrate 16 is held in intimate contact with heating track 25 (and silicon substrate 12) by forces indicated by arrows 36 and 38. Power source 34 passes current through heating track 25 (via probes 30 and 32 and contact pads 26 and 28) such that heating track 25 generates heat that bonds substrate 16 to substrate 12 at locations 20 and 22.

FIG. 2 shows a top view of silicon substrate 12, device 14 and micro-heater 24 of FIG. 1 to illustrate contact areas 26, 28 and heating track 25 prior to bonding of second substrate 16 (not shown in FIG. 2). Heating track 25 is positioned to form a bond around device 14, as shown. Accordingly, as shown, a significant percentage of the surface area of silicon substrate 12 is consumed by contact areas 26 and 28 as compared to the area of device 14 and heating track 25; this reduces production yield as described in connection with FIG. 3.

In particular, FIG. 3 shows a prior art wafer 50 with twenty three fabricated devices 14. Each device 14 has a micro-heater 24 that cooperates with the other micro-heaters to simultaneously encapsulate devices 14, as in FIG. 1. To simultaneously encapsulate all individual devices 14 on wafer 50, micro-heaters 24 are connected in parallel to power busses 52 and 54, as shown. Thus, a single second substrate (e.g., second substrate 16) may be bonded to substrate 12 by completion of the electrical circuit to power busses 52 and 54 so that all devices 14 are simultaneously encapsulated.

Power busses 52 and 54 also consume space to facilitate simultaneous encapsulation of each device 14. Space consumed by contact areas 26 and 28 of each micro-heater 24 and/or by busses 52 and 54 represents a significant proportion of wafer 50, and, thus, reduces the yield of devices 14 from wafer 50. Increased yield of devices 14 from wafer 50 is desirable.

SUMMARY OF THE INVENTION

The present disclosure advances the art by providing a system and method for wafer bonding by localized induction heating.

In particular and by way of example only, according to an embodiment, a method bonds wafers using localized induction heating. One or more induction micro-heaters are formed with a first substrate to be bonded. A second substrate is positioned in intimate contact with the induction micro-heaters. An alternating magnetic field is generated to induce a current in the induction micro-heaters, to form one or more bonds between the first substrate and the second substrate.

DETAILED DESCRIPTION OF THE FIGURES

Figure 4:
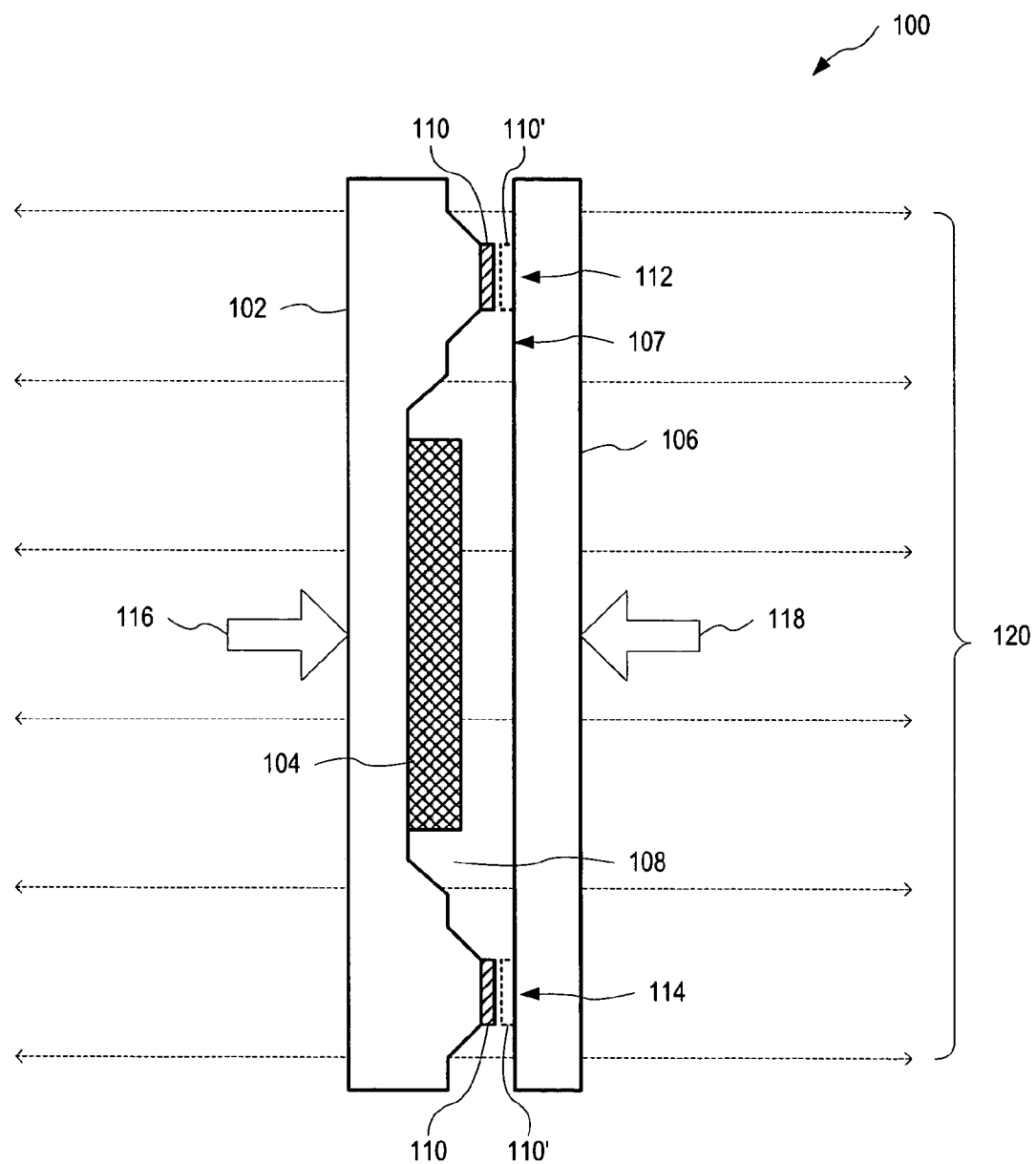
FIG. 4 is a cross-section view of one exemplary package embodiment illustrating encapsulation of a device on a silicon substrate by an induction micro-heater.

FIG. 4 shows a cross-section through one exemplary package 100 illustrating an induction micro-heater 110 that bonds a first substrate 102 to a second substrate 106, to encapsulate a device 104. First substrate 102 is, for example, part of a silicon wafer (e.g., part of wafer 150, FIG. 6). Second substrate 106 is, for example, a Pyrex glass lid. Device 104 is, for example, a silicon based integrated circuit ("IC") or a micro-electromechanical system ("MEMS") device created using IC or MEMS fabrication processes.

Induction micro-heater 110 is deposited on first substrate 102 in the form of an electrically conductive heating track that provides rapid localized heating, at locations 112 and 114, to bond first substrate 102 to second substrate 106. Once bonded, device 104 is encapsulated within a chamber 108 formed between first substrate 102 and second substrate 106. In one embodiment, induction micro-heater 110 is gold, and the bond formed at locations 112 and 114 between first substrate 102 and second substrate 106 is an eutectic Au—Si alloy bond.

Figure 5:
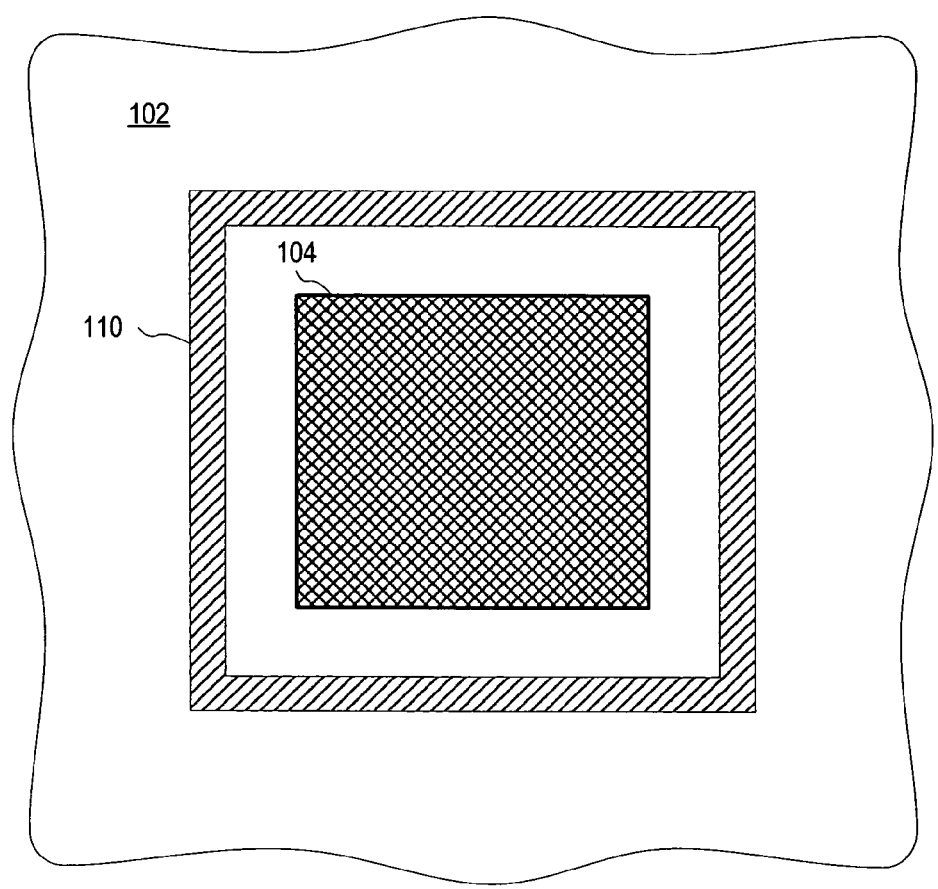
FIG. 5 shows a top view of the silicon substrate of FIG. 4 illustrating positioning of the induction micro-heater to form a bond around the device.

Induction micro-heater 110 is activated by applying an alternating magnetic field 120 to package 100 such that current is induced in induction micro-heater 110, generating heat at locations 112, 114. As shown in FIG. 5, induction micro-heater 110 may be a loop (e.g., a single short circuited turn) such that current flows around the loop. The strength and frequency of magnetic field 120 is adjusted such that induction micro-heater 110 generates sufficient heat to bond first substrate 102 to second substrate 106 without damaging device 104.

In another embodiment, second substrate 106 has an induction micro-heater 110' deposited on a surface 107 to align with induction micro-heater 110, such that a metal to metal (e.g., gold-to-gold or solder-to-solder) bond is formed between substrates 102, 106 when magnetic field 120 is applied. In another embodiment, induction micro-heater 110 is made from solder (e.g., lead-tin) such that the solder forms the bond between first substrate 102 and second substrate 106 when magnetic field 120 is applied.

Though FIG. 5 shows a shorted single turn inductor, other configurations and layouts of induction micro-heater 110 may be used without departing from the scope herein. Once the configuration is selected, the frequency and strength of magnetic field 120 is adjusted to operate induction micro-heater 110.

Figure 1:
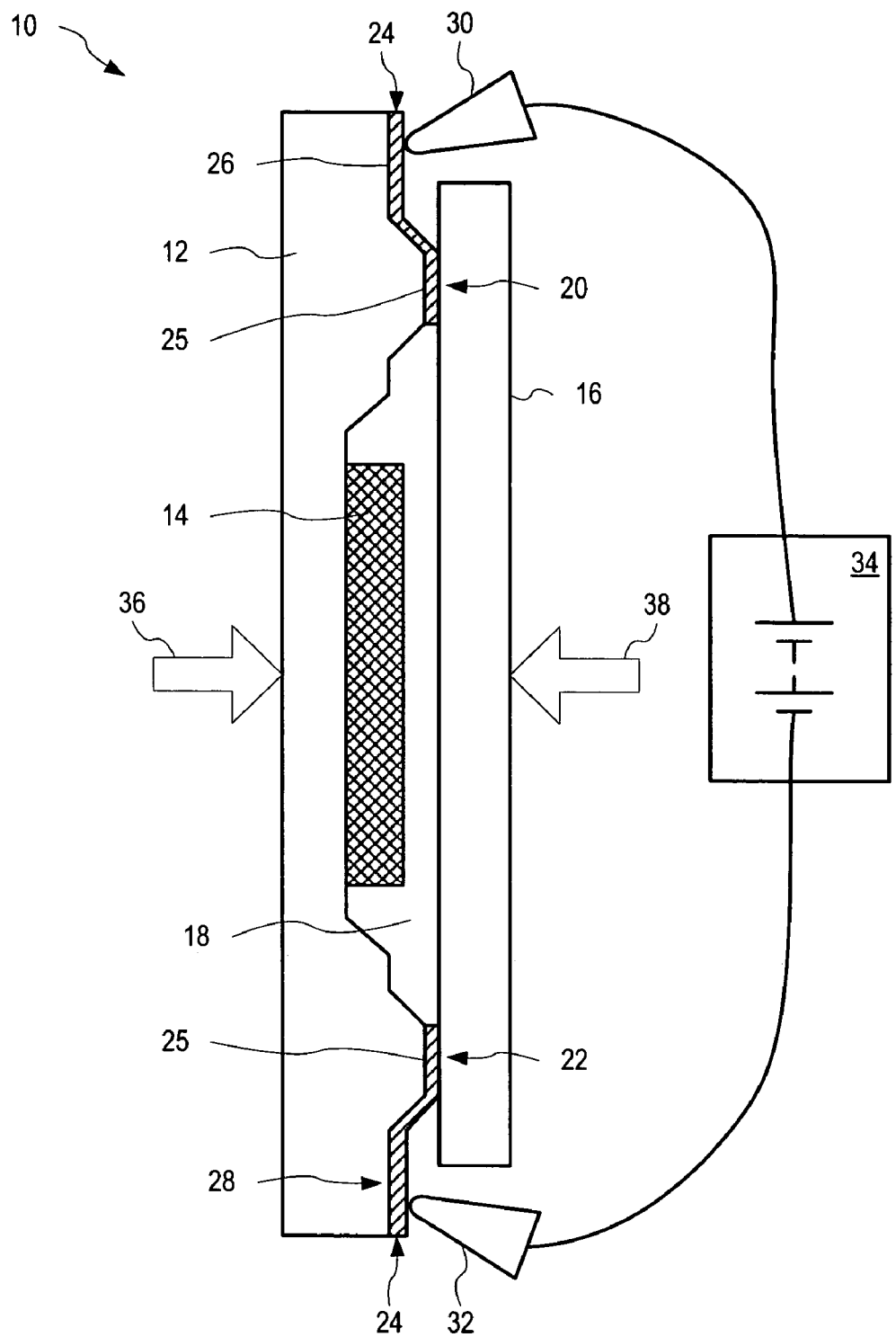
FIG. 1 shows a cross-section through a prior art package that encapsulates a device within a cavity formed between two substrates using a micro-heater.
Figure 2:
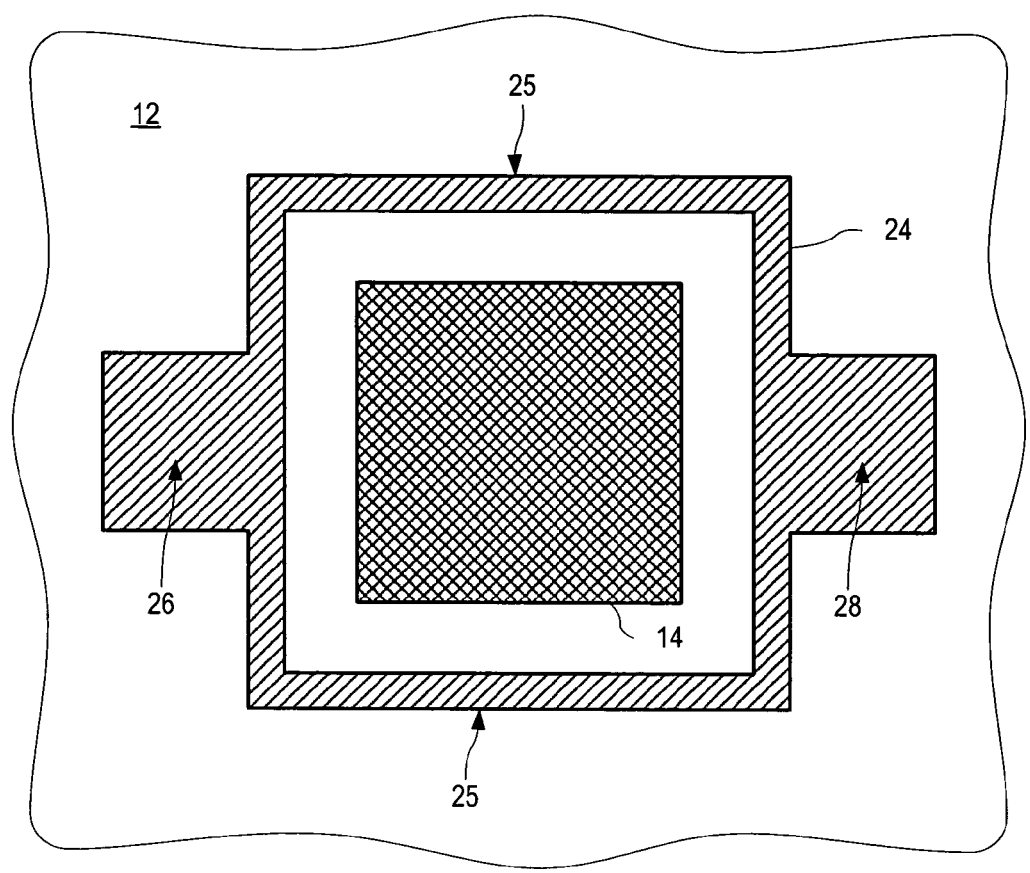
FIG. 2 shows a top view of silicon substrate, device and micro-heater of FIG. 1.

As appreciated, and unlike FIG. 2, space for electrical connection is not used on first substrate 102 since electrical connection to induction micro-heater 110 is not required. More specifically, as induction micro-heater 110 is powered by a current generated within induction micro-heater 110 by magnetic field 120, external electrical contacts and conductors for direct connection to an external power supply are advantageously not required and may be omitted from the fabrication process. Removing unnecessary electrical contacts and conductors from substrate 102 advantageously provides additional fabrication space for additional packages 100 upon substrate 102.

Figure 3:
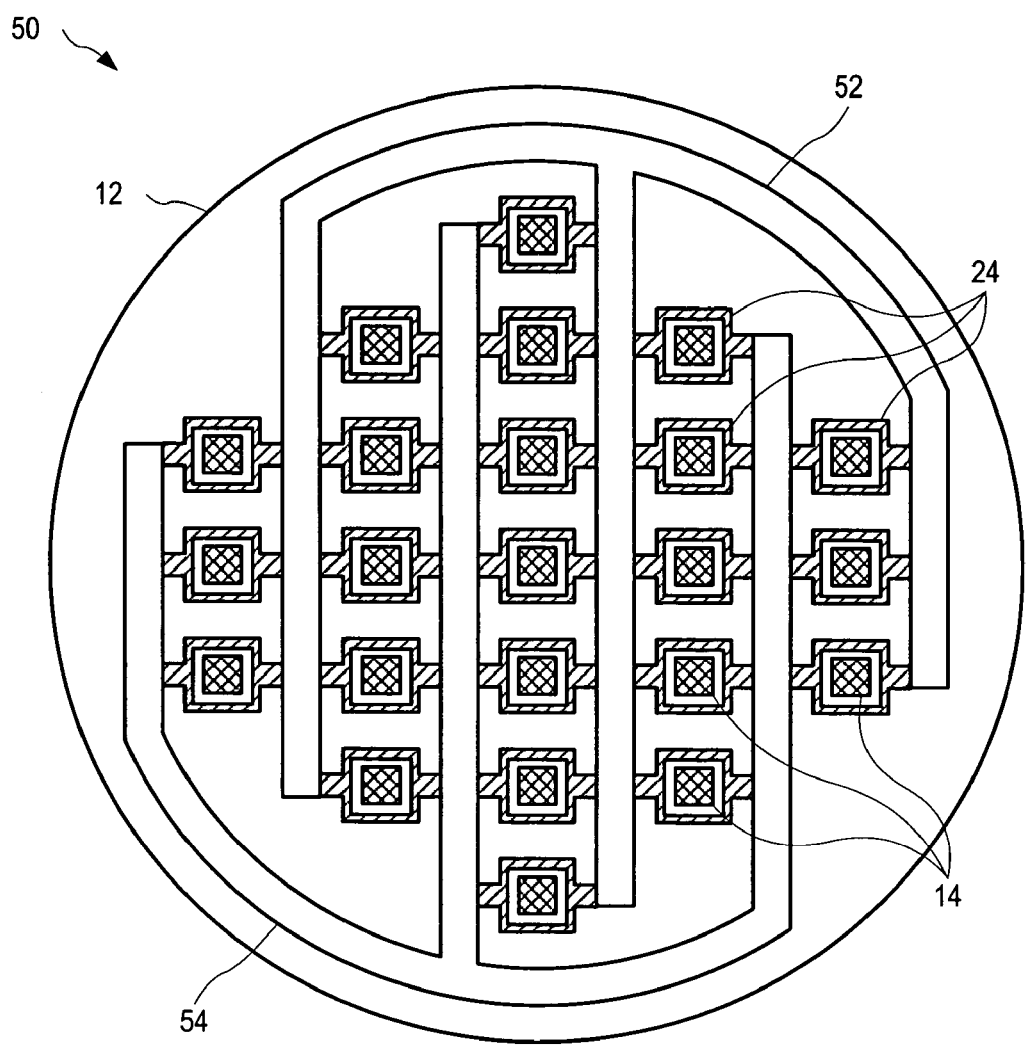
FIG. 3 shows an extended production wafer with twenty three fabricated devices, each device having a micro-heater connected to a common bus for simultaneous encapsulation.
Figure 6:
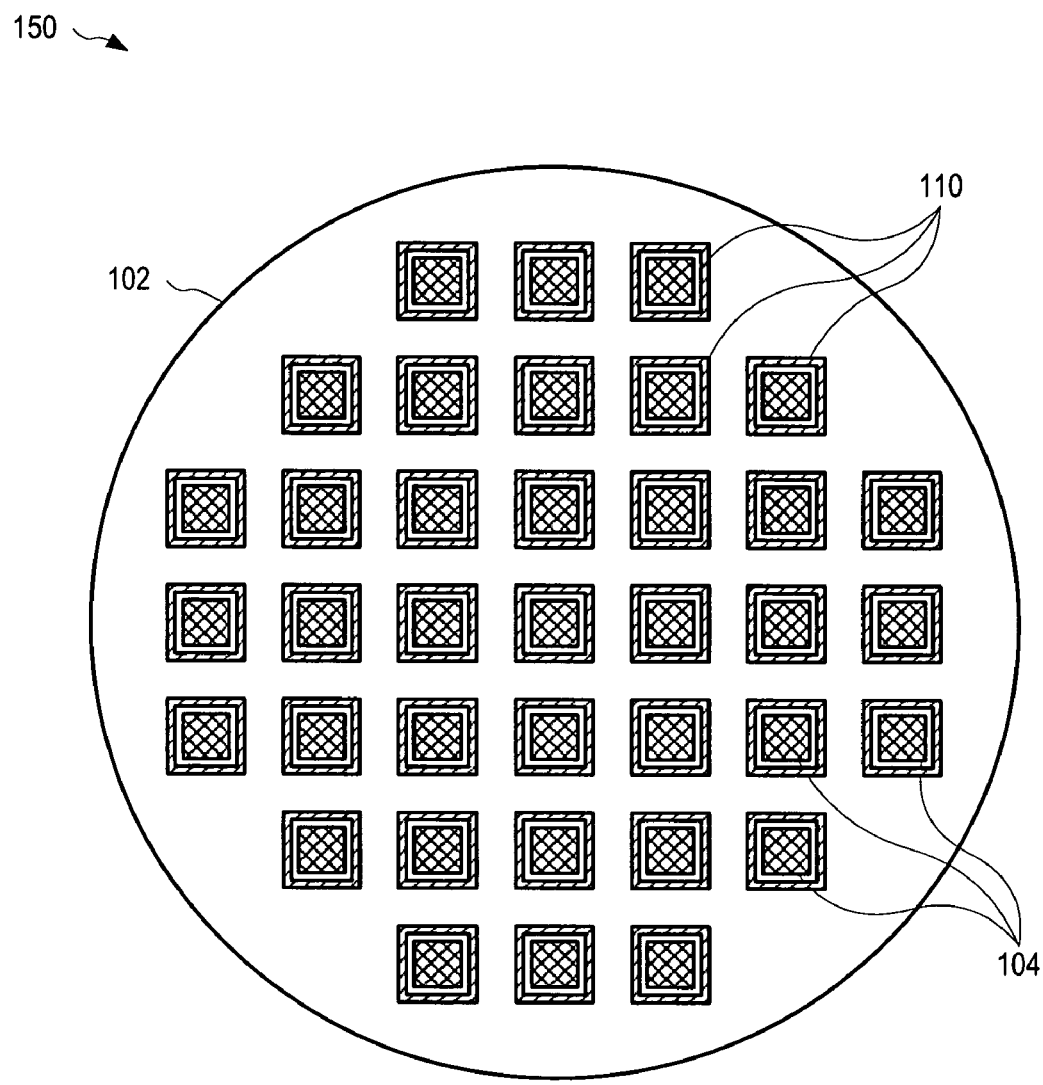
FIG. 6 shows one exemplary production wafer embodiment illustrating fabrication of thirty seven devices, each device with one induction micro-heater.

To illustrate the yield advantages that may be realized using induction micro-heater 110, FIG. 6 shows one exemplary wafer 150 illustrating fabrication of thirty seven devices 104; each device 104 has one induction micro-heater 110. Because electrical connection to induction micro-heater 110 is not required, the usable density of wafer 150 may be increased as compared, for example, to the usable density of wafer 50, FIG. 3. Further, since electrical connections are not required for induction micro-heaters 110, power busses are not required on wafer 150 and electrical connection to wafer 150 is not required during bonding.

Figure 7:
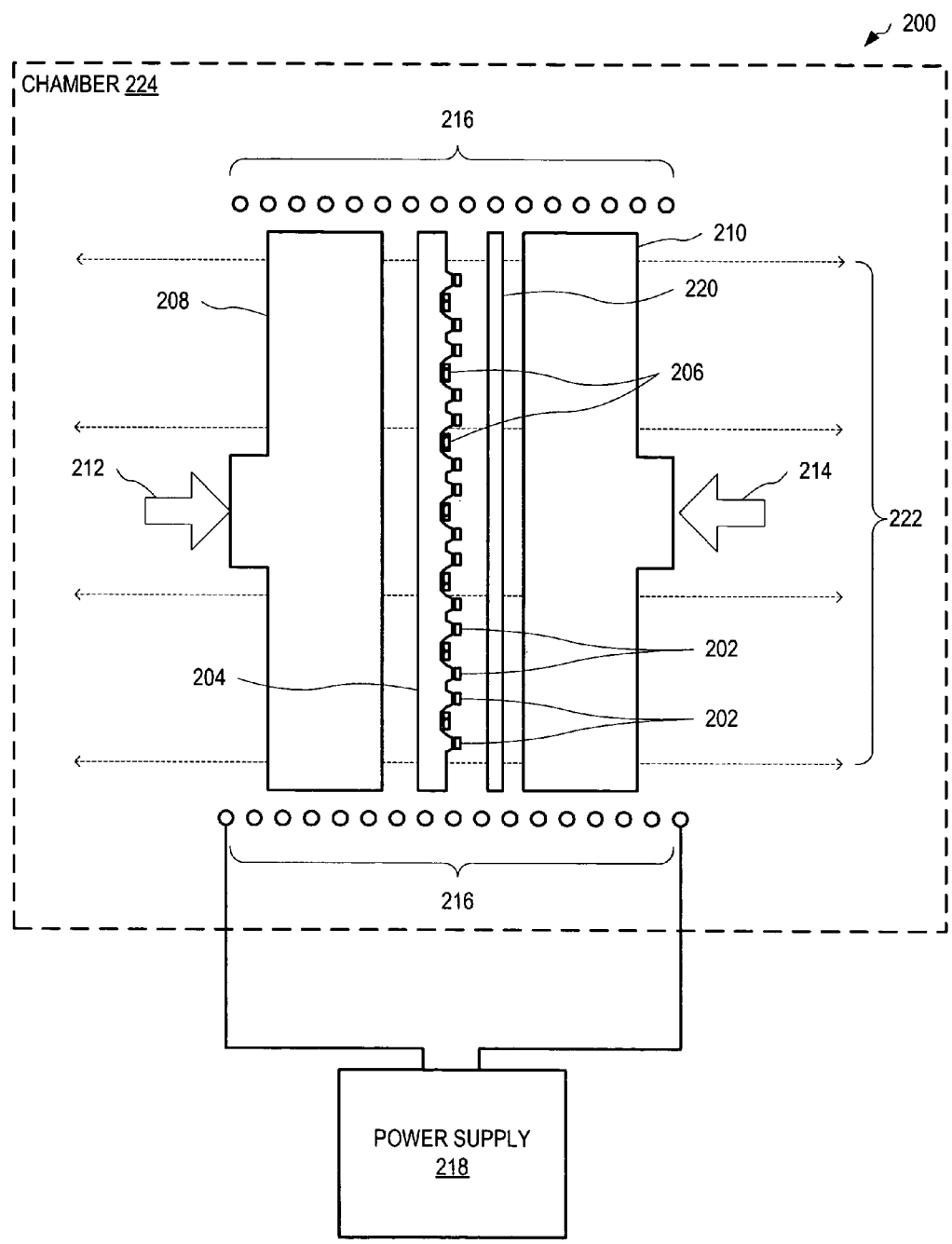
FIG. 7 is a schematic illustrating one system embodiment for wafer bonding by localized induction heating.

FIG. 7 is a schematic illustrating one system 200 for wafer bonding by localized induction heating. System 200 uses a plurality of induction micro-heaters 202 to bond a substrate 220 to wafer 204 to encapsulate a plurality of devices 206 (e.g., MEMS devices or IC devices). Wafer 204 is, for example, first substrate 102, and substrate 220 is, for example, second substrate 106, shown in FIG. 4. Induction micro-heaters 202 are deposited on wafer 204 such that each induction micro-heater 202 surrounds one device 206 to provide localized heating for bonding wafer 204 to substrate 220.

Platens 208 and 210 apply forces (as respectively indicated by arrows 212 and 214) to wafer 204 and substrate 220, thereby maintaining intimate contact between substrate 220 and induction micro-heaters 202 during bonding. A coil 216 is positioned such that an alternating magnetic field 222 is selectively generated proximate to wafer 204 and induction heating occurs in induction micro-heaters 202. Platens 212 and 214 may be constructed of non-conductive materials, such as quartz, that do not influence magnetic field 222, for example. Coil 216 connects to a power supply 218 that controls the frequency and intensity of magnetic field 222 such that the bonding between wafer 204 and substrate 220 occurs without damage to devices 206.

Bonding may occur within a chamber 224 that facilitates additional control of the encapsulation environment. In one example, chamber 224 is evacuated such that devices 206 are encapsulated within a vacuum. Such vacuum encapsulation may therefore provide at least a partial vacuum within each bonded package 100 (see FIG. 4). In another example, chamber 224 is evacuated and filled with one or more select gases such that devices 206 are encapsulated within an environment consisting of the select gases. Such gasses therefore encapsulated within each bonded package 100 may serve to maintain the internal environment of each package 100 (see FIG. 4). In another example, other environmental conditions (e.g., humidity) within chamber 224 are controlled during bonding so that encapsulation of devices 206 occurs within those environmental conditions.

Figure 8:
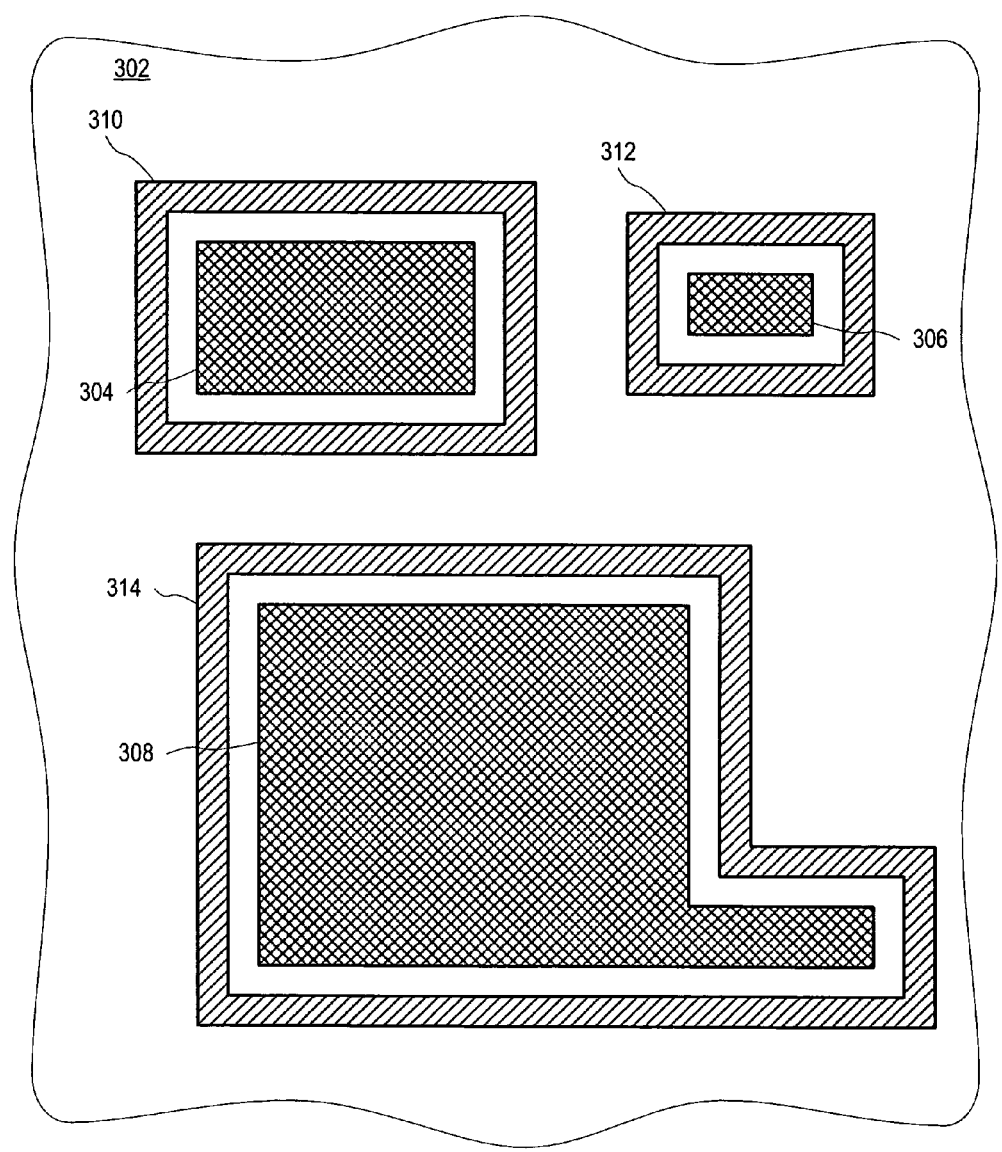
FIG. 8 shows a silicon substrate containing three different sized devices for encapsulation.

FIG. 8 shows a substrate 302 containing three different sized devices 304, 306 and 308 for encapsulation. Substrate 302 is, for example, wafer 204, FIG. 7. Device 304 is surrounded by induction micro-heater 310; device 306 is surrounded by induction micro-heater 312; and device 308 is surrounded by induction micro-heater 314. As appreciated, fewer or more different sized induction micro-heaters may be included with substrate 302.

A first frequency is selected for optimal operation of induction micro-heater 310, a second frequency is selected for optimal operation of induction micro-heater 312 and a third frequency is selected for optimal operation of induction micro-heater 314. As in FIG. 7, a power supply 218 may for example operate to drive coil 216 to produce magnetic field 222 that, in this example, includes these three selected frequencies: the first frequency selected for induction micro-heater 310; the second frequency selected for induction micro-heater 312; and the third frequency selected for induction micro-heater 314. As appreciated, fewer or more frequencies may be included in magnetic field 222 in correspondence with the different sized induction micro-heaters.

Because, power supply 218 operates coil 216 to produce magnetic field 222 with relatively low frequencies, magnetically and/or electrically sensitive components (e.g., micro-resonators) of devices 304, 306 and 308 are not damaged by magnetic field 222. Specifically, since these sensitive components are smaller than the loops of induction micro-heaters 310, 312 and 314, magnetic induction for these components occurs at higher frequencies. The components are therefore not 'tuned' to the frequencies generated by power supply 218 and remain undamaged by magnetic field 222.

Figure 9:
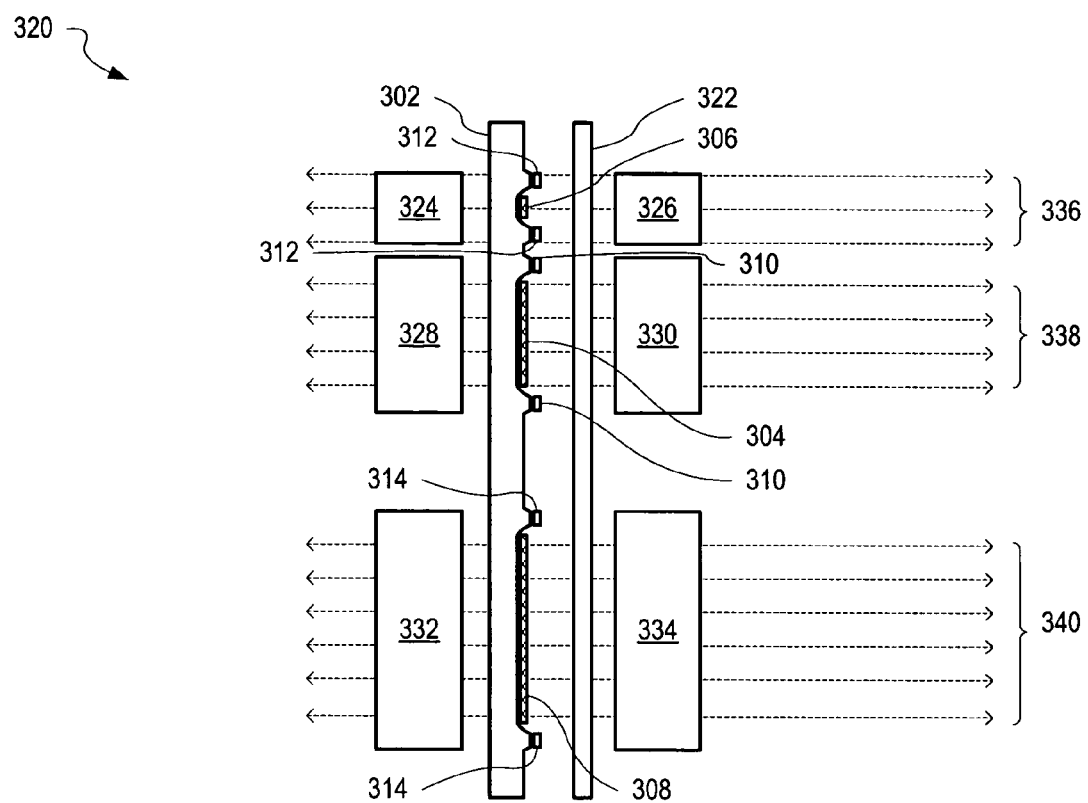
FIG. 9 is a schematic illustrating one system embodiment for generating a plurality of magnetic fields to encapsulate the three different sized devices of FIG. 8.

FIG. 9 is a schematic illustrating one system 320 for generating a plurality of magnetic fields 336, 338 and 340 to encapsulate devices 304, 306 and 308 of FIG. 8. Substrate 302 is shown with devices 304, 306 and 308 and induction micro-heaters 310, 312 and 314. A substrate 322 is positioned in intimate contact with induction micro-heaters 310, 312 and 314.

On one side of substrate 302, a first magnetic coil 324 is positioned proximate to induction micro-heater 312, as shown, to generate magnetic field 336; magnetic field 336 in turn generates current and heating within micro-heater 312 to bond substrate 322 to substrate 302, thereby encapsulating device 306 therebetween. A second magnetic coil 326 may be positioned on the other side of wafer 302, and proximate to induction micro-heater 312, as shown, to assist in generating magnetic field 336.

On one side of substrate 302, a third magnetic coil 328 is positioned proximate to induction micro-heater 310, as shown, to generate magnetic field 338; magnetic field 338 in turn generates current and heating within micro-heater 310 to bond substrate 322 to substrate 302, thereby encapsulating device 304 therebetween. A fourth magnetic coil 330 may be positioned on the other side of wafer 302, and proximate to induction micro-heater 310, as shown, to assist in generating magnetic field 338.

On one side of substrate 302, a fifth magnetic coil 332 is positioned proximate to induction micro-heater 314, as shown, to generate magnetic field 340; magnetic field 340 in turn generates current and heating within micro-heater 314 to bond substrate 322 to substrate 302, thereby encapsulating device 308 therebetween. A sixth magnetic coil 334 may be positioned on the other side of wafer 302, and proximate to induction micro-heater 314, as shown, to assist in generating magnetic field 340.

A power supply (e.g., power supply 218, FIG. 7) drives magnetic coil 324 (and optionally magnetic coil 326) to generate magnetic field 336 with a frequency suitable for induction micro-heater 312. The power supply drives magnetic coil 328 (and optionally magnetic coil 330) to generate magnetic field 338 with a frequency suitable for induction micro-heater 310. The power supply drives magnetic coil 332 (and optionally magnetic coil 334) to generate magnetic field 340 with a frequency suitable for induction micro-heater 314.

Coils 324, 326, 328, 330, 332 and 334 may be driven simultaneously, sequentially, or in another manner, to operate induction micro-heaters 312, 310 and 314. In one embodiment, magnetic coils 324, 328 and 332 are integrated with platen 208 and magnetic coils 326, 330 and 334 are integrated with platen 210 of FIG. 7, whereby operation of magnetic coils 324, 328 and 332 induces current within induction micro-heaters 312, 310 and 314 simultaneously with opposing forces of platens 208, 210.

It should thus be apparent that fewer or more magnetic coils may be included to generate appropriate magnetic fields that encapsulate devices of various sizes through bonding by localized induction heating. Moreover, the magnetic coils may be shaped to precisely match the desired bond lines of the induction micro-heaters.

Figure 10:
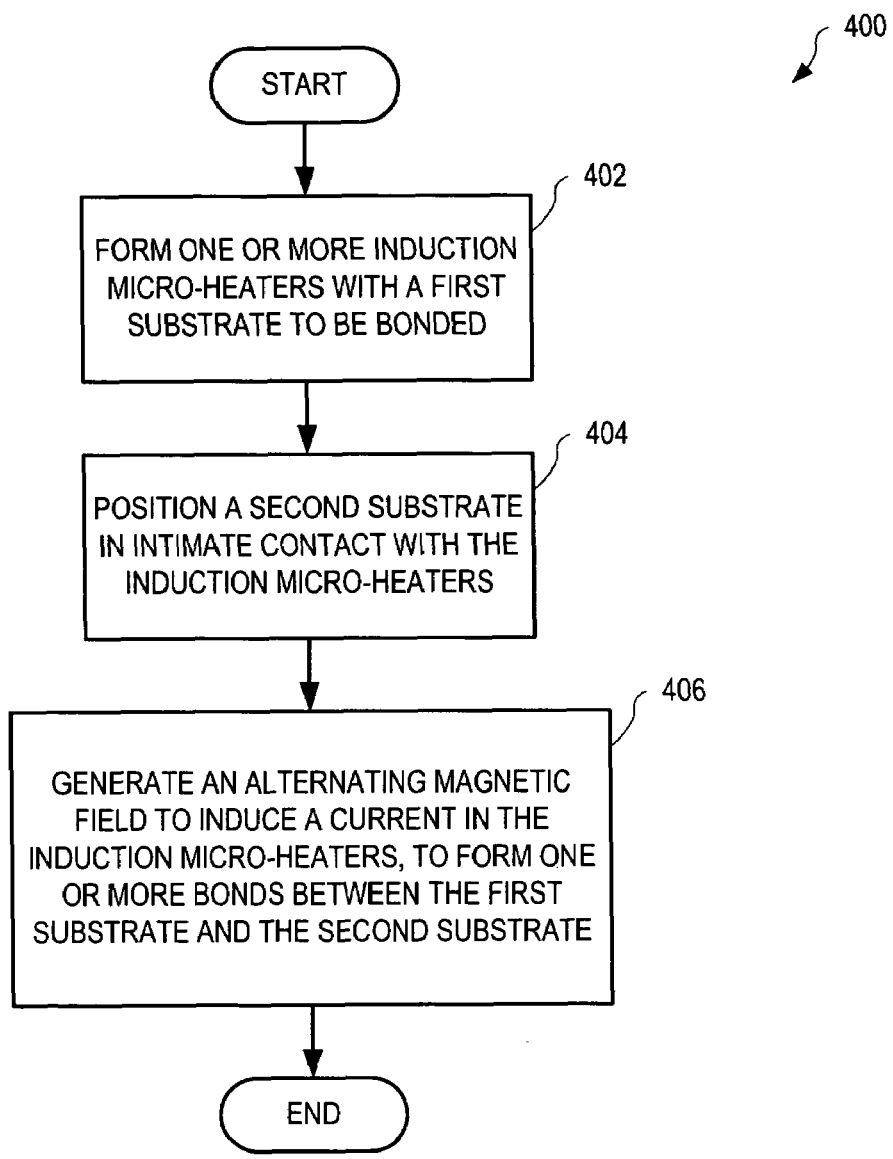
FIG. 10 is a flowchart illustrating one exemplary process embodiment for wafer bonding using rapid localized induction heating.

FIG. 10 is a flowchart illustrating one exemplary process 400 for wafer bonding using rapid localized induction heating. It will be appreciated that the described process need not be performed in the order in which it is herein described, but that this description is merely exemplary of one exemplary process 400.

In step 402, one or more induction micro-heaters (e.g., induction micro-heaters 110, 202, 310, 312 and 314 - as discussed above) are deposited with a first substrate (e.g., substrate 102, wafers 150, 204) to be bonded. In step 404, a second substrate (e.g., substrates 106 and 220) is positioned in intimate contact with the induction micro-heaters. In one example of step 404, platens 208 and 210 are used to apply forces 212 and 214 to wafer 204 and substrate 220, respectively, thereby ensuring intimate contact between substrate 220 and induction micro-heaters 202. In step 406, an alternating magnetic field containing selected frequencies is generated to induce a current in the induction micro-heaters to generate heat to form the desired bonds between the first substrate and the second substrate.

Using induction micro-heaters, localized heat is produced for bonding purposes without utilization of additional space on a silicon substrate and/or wafer for electrical connections to the micro-heaters.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for wafer bonding using localized induction heating, comprising:
    forming one or more induction micro-heaters with a first substrate to be bonded wherein forming one or more induction micro-heaters comprises forming a plurality of induction micro-heaters having at least two different geometric shapes, wherein generating a first alternating magnetic field comprises generating the first alternating magnetic field with a first frequency corresponding to a first one of the geometric shapes, and further comprising generating at least one second alternating magnetic field with at least one second frequency to induce current within induction micro-heaters having another one of the geometric shapes, to form an additional bond between the first substrate and the second substrate;
    positioning a second substrate in intimate contact with the induction micro-heaters; and
    generating a first alternating magnetic field to induce current in the induction micro-heaters, to form one or more bonds between the first substrate and the second substrate.

2. The method of claim 1, further comprising selecting one or more frequencies based upon shape of the induction micro-heaters, wherein the first magnetic field contains the selected frequencies to form the bonds.

3. The method of claim 1, further comprising selecting one or more frequencies based upon size of the induction micro-heaters, wherein the first magnetic field contains the selected frequencies to farm the bonds.

4. The method of claim 1, wherein forming one or more induction micro-heaters comprises depositing a gold track on a surface of the first substrate.

5. The method of claim 1, wherein forming one or more induction micro-heaters comprises depositing a solder track on a surface of the first substrate.

6. The method of claim 1, wherein forming one or more induction micro-heaters comprises at least one of the micro-heaters into a loop.

7. The method of claim 1, wherein forming one or more induction micro-heaters comprises at least one of the micro-heaters into a strip.

8. The method of claim 1, wherein forming one or more induction micro-heaters comprises disposing the induction micro-heaters around at least one device of the first substrate such that a chamber encapsulates the device between the first and second substrates during the generating of the alternating magnetic field.

9. A method for wafer bonding using localized induction heating, comprising:
depositing one or more first induction micro-heaters on a first surface of a first substrate to be bonded;
depositing one or more second induction micro-heaters on a second surface of a second substrate to be bonded;
wherein depositing one or more first induction micro-heaters and depositing one or more second induction micro-heaters comprises forming a plurality of induction micro-heaters having at least two different geometric shapes, wherein generating a first alternating magnetic field comprises generating the first alternating magnetic field with a first frequency corresponding to a first one of the geometric shapes, and further comprising generating at least one second alternating magnetic field with at least one second frequency to induce current within induction micro-heaters having another one of the geometric shapes, to form an additional bond between the first substrate and the second substrate;
positioning the first and second substrates such that the first and second induction micro-heaters are in intimate contact and the first and second micro-beaters are aligned; and
generating one or more alternating magnetic fields to induce current in the first and second induction micro-heaters, to generate heat to form one or more bonds between the first substrate and the second substrate.

10. The method of claim 9, further comprising selecting one or more frequencies based upon shape of the first and second induction micro-heaters, wherein the magnetic field contains the selected frequencies to form the bonds.

11. The method of claim 9, further comprising selecting one or more frequencies based upon size of the first and second induction micro-heaters, wherein the magnetic fields contain the selected frequencies to form the bonds.

12. The method of claim 9, wherein depositing one or more first induction micro-heaters and depositing one or more second induction micro-heaters comprises depositing a gold track on at least one of the first and second surfaces.

13. The method of claim 9, wherein depositing one or mare first induction micro-heaters and depositing one or mare second induction micro-heaters comprises depositing a solder track on at least one of the first and second surfaces.

14. The method of claim 9, wherein depositing one or more first induction micro-heaters and depositing one or more second induction micro-heaters comprises forming the induction micro-heaters into loops.

15. The method of claim 9, wherein depositing one or more first induction micro-heaters and depositing one or more second induction micro-heaters comprises forming the induction micro-heaters into strips.

16. The method of claim 9, further comprising controlling environmental conditions such that a chamber formed between the first and second substrates comprises the environmental conditions.

17. A method for wafer bonding by localized induction heating, comprising:
forming a plurality of induction micro-heaters with a first substrate to be bonded wherein forming a plurality of induction micro-heaters comprises forming a plurality of induction micro-heaters having at least two different geometric shapes, wherein generating a first alternating magnetic field comprises generating the first alternating magnetic field with a first frequency corresponding to a first one of the geometric shapes, and further comprising generating at least one second alternating magnetic field with at least one second frequency to induce current within induction micro-heaters having another one or the geometric shapes, to form an additional bond between the first substrate and the second substrate;
positioning a second substrate in intimate contact with the induction micro-heaters; and
generating a plurality of alternating magnetic fields to induce current in the induction micro-heaters, to form one or more bonds between the first substrate and the second substrate.

* * * * *

UNITED STATES PATENT AND TRADEMARK OFFICE
CERTIFICATE OF CORRECTION

PATENT NO. : 7,332,411 B2  Page 1 of 1
APPLICATION NO. : 10/917123
DATED : February 19, 2008
INVENTOR(S) : James McKinnell et al.

It is certified that error appears in the above-identified patent and that said Letters Patent is hereby corrected as shown below:

In column 6, line 53, in Claim 3, delete "farm" and insert -- form --, therefor.

In column 7, line 26, in Claim 9, delete "micro-beaters" and insert -- micro-heaters --, therefor.

In column 8, line 4, in Claim 13, delete "mare" and insert -- more --, therefor.

In column 8, line 5, in Claim 13, delete "mare" and insert -- more --, therefor.

In column 8, line 32, in Claim 17, delete "or" and insert -- of --, therefor.

Signed and Sealed this

Fifteenth Day of July, 2008

JON W. DUDAS
*Director of the United States Patent and Trademark Office*